(12) United States Patent
Okamura

(10) Patent No.: US 10,948,854 B2
(45) Date of Patent: Mar. 16, 2021

(54) BIAS CIRCUIT, IMAGE FORMATION DEVICE AND IMAGE FORMING APPARATUS

(71) Applicant: Hiroshi Okamura, Kanagawa (JP)

(72) Inventor: Hiroshi Okamura, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/574,436

(22) Filed: Sep. 18, 2019

(65) Prior Publication Data
US 2020/0103792 A1    Apr. 2, 2020

(30) Foreign Application Priority Data

Sep. 27, 2018 (JP) .............................. JP2018-182880

(51) Int. Cl.
| | | |
|---|---|---|
| G03G 15/16 | (2006.01) | |
| G03G 15/00 | (2006.01) | |
| G05F 3/18 | (2006.01) | |
| G03G 21/16 | (2006.01) | |
| H01L 29/866 | (2006.01) | |

(52) U.S. Cl.
CPC ..... *G03G 15/1675* (2013.01); *G03G 15/5004* (2013.01); *G03G 15/80* (2013.01); *G03G 21/1652* (2013.01); *G05F 3/18* (2013.01); *G03G 2215/00978* (2013.01); *H01L 29/866* (2013.01)

(58) Field of Classification Search
CPC .. G03G 15/065; G03G 15/80; G03G 15/1675; G03G 15/0266; G03G 15/0283; G03G 15/5004; G03G 15/5037
See application file for complete search history.

(56) References Cited

U.S. PATENT DOCUMENTS

| | | | |
|---|---|---|---|
| 7,251,444 B2 | 7/2007 | Matsuda et al. | |
| 7,376,375 B2 | 5/2008 | Kobayashi et al. | |
| 7,386,262 B2 | 6/2008 | Okamura et al. | |
| 7,454,150 B2 | 11/2008 | Matsuda et al. | |
| 8,837,975 B2 | 9/2014 | Komai et al. | |
| 8,950,750 B2 | 2/2015 | Wakabayashi et al. | |
| 9,499,363 B2 | 11/2016 | Wakabayashi et al. | |
| 9,551,951 B2 | 1/2017 | Tsutsumi | |
| 2004/0075346 A1* | 4/2004 | Kim ........................ | H02J 1/08 307/85 |

(Continued)

FOREIGN PATENT DOCUMENTS

| | | |
|---|---|---|
| JP | H05-002301 | 1/1993 |
| JP | 2013-130806 | 7/2013 |
| JP | 2016-161881 | 9/2016 |

*Primary Examiner* — Walter L Lindsay, Jr.
*Assistant Examiner* — Jessica L Eley
(74) *Attorney, Agent, or Firm* — IPUSA, PLLC

(57) ABSTRACT

A bias circuit includes one or more first Zener diodes electrically coupled to a member provided in a replacement unit, the one or more first Zener diodes being coupled in series. When the replacement unit is removably attached to a main unit including a power supply that has one or more second Zener diodes coupled in series, the first Zener diodes are electrically coupled to the second Zener diodes in parallel to change a bias voltage to be applied to the member, the bias voltage being supplied by the power supply. A total absolute value of breakdown voltages across the first Zener diodes is lower than a total absolute value of breakdown voltages across the second Zener diodes.

15 Claims, 7 Drawing Sheets

(56) References Cited

U.S. PATENT DOCUMENTS

2005/0264959 A1\* 12/2005 Kim .................. G03G 15/80
                                                  361/18
2006/0133873 A1    6/2006 Andoh et al.
2007/0053707 A1\* 3/2007 Ream ................. G03G 15/065
                                                  399/55

\* cited by examiner

US 10,948,854 B2

BIAS CIRCUIT, IMAGE FORMATION DEVICE AND IMAGE FORMING APPARATUS

CROSS-REFERENCE TO RELATED APPLICATION

The present application claims priority under 35 U.S.C. § 119 to Japanese Patent Application No. 2018-182880, filed Sep. 27, 2018, the contents of which are incorporated herein by reference in their entirety.

BACKGROUND OF THE INVENTION

1. Field of the Invention

The present disclosure relates to a bias circuit, an image formation device, and an image forming apparatus.

2. Description of the Related Art

Some electrophotographic image forming apparatuses are known to include a control member that contacts with a surface of a toner carrier to control a thickness of a toner layer. A control bias voltage that has a same polarity as toner is applied to such a control member to prevent the toner from accumulating on the control member.

In such an apparatus, an additive, finely divided toner or the like which has an opposite polarity to an applied control bias voltage is attracted to the control member, and adheres to the control member, which may result in an abnormal image such as scumming. In light of the point described above, in order to prevent the above abnormal image, with respect to a commercially available product, when an image formation unit such as a replaceable PCU (Process Cartridge Unit), which is capable of being detached from an image forming apparatus, is replaced, a control bias voltage applied to a control member in the image formation unit is changed to be decreased. When a control bias voltage is decreased, attraction of an additive, finely divided toner or the like that has an opposite polarity may be suppressed. Formation of abnormal images can be prevented accordingly.

As a device that changes a bias voltage applied to a given member such as a control member in an image formation unit when the image formation unit is replaced, a device that includes a plurality of Zener diodes having different breakdown voltages in an image formation unit is disclosed. Such Zener diodes are switched by a switching mechanism, and a desired bias voltage is applied to the given member accordingly (e.g., Japanese Unexamined Patent Application Publication No. 5-2301 which may be hereafter referred to as Patent Document 1).

SUMMARY OF THE INVENTION

The device disclosed in Patent Document 1 includes the switching mechanism for coupling a given Zener diode.

In one aspect according to the present disclosure, a bias circuit includes one or more first Zener diodes electrically coupled to a member provided in a replacement unit, the one or more first Zener diodes being coupled in series. When the replacement unit is removably attached to a main unit including a power supply that has one or more second Zener diodes coupled in series, the first Zener diodes are electrically coupled to the second Zener diodes in parallel to change a bias voltage to be applied to the member, the bias voltage being supplied by the power supply. A total absolute value of breakdown voltages across the first Zener diodes is lower than a total absolute value of breakdown voltages across the second Zener diodes.

DETAILED DESCRIPTION OF THE EMBODIMENTS

Figure 1:
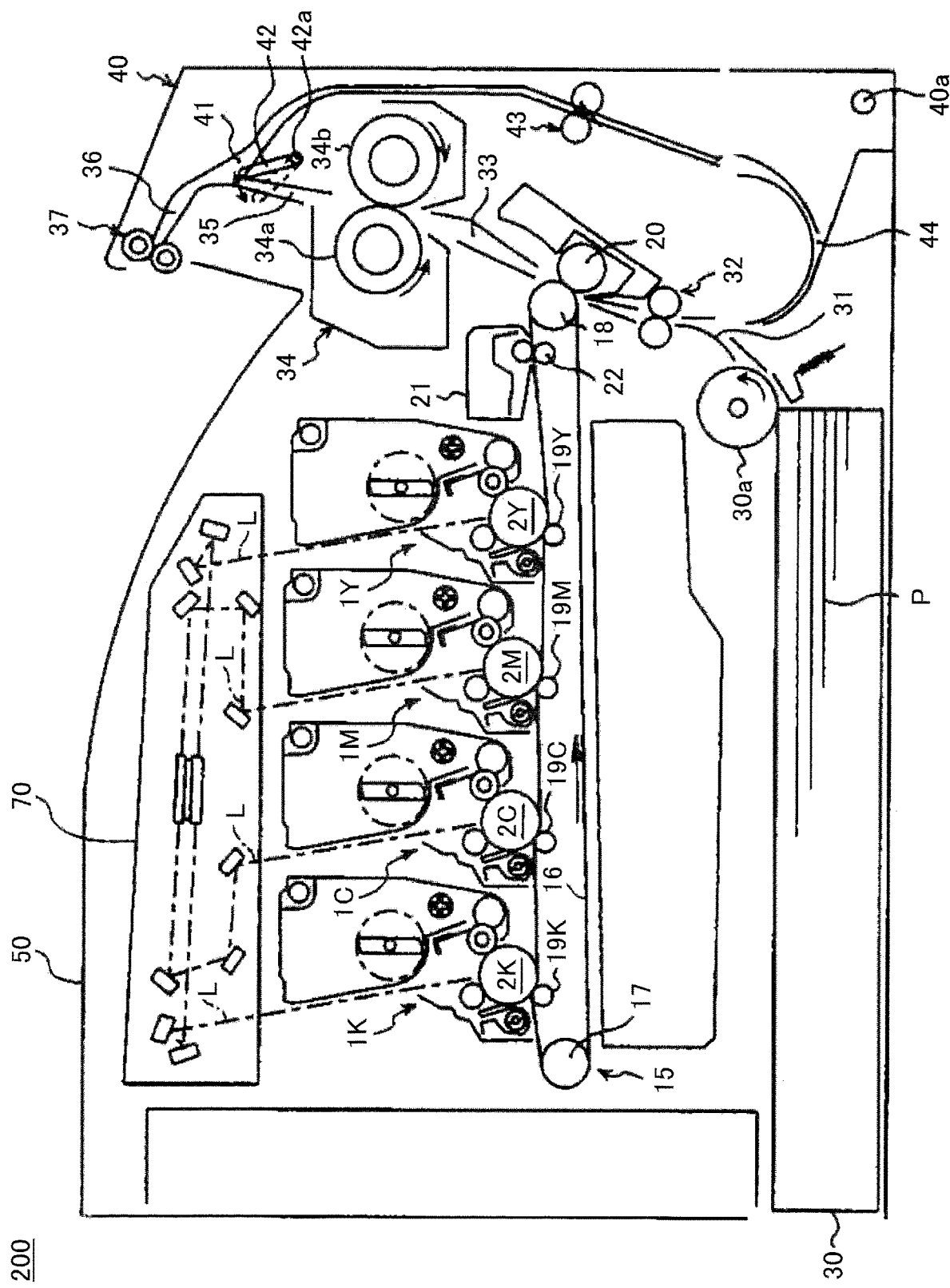
FIG. 1 is a diagram for explaining an example of a configuration of an image forming apparatus according to an embodiment.

Explanation will be hereinafter provided for one or more embodiments with reference to the drawings. In each figure, the same reference numerals are used to denote same elements; accordingly, for those elements, the explanation may be omitted.

First Embodiment

In the present embodiment, a color image forming apparatus of the electrophotographic type will be described by way of example.

<Configuration of Image Forming Apparatus>

FIG. 1 is a diagram for explaining an example of a configuration of an image forming apparatus 200 according to the present embodiment. In FIG. 1, the image forming apparatus 200 includes four image formation units 1Y, 1M, 1C, and 1K that are respectively used for forming toner images of yellow, magenta, cyan, and black (which may be hereafter referred to as Y, M, C, and K). The respective formation image units form toner images of Y, M, C and K toners that have different colors. Each of the formation image units is replaced on attaining lifespan.

Figure 2:
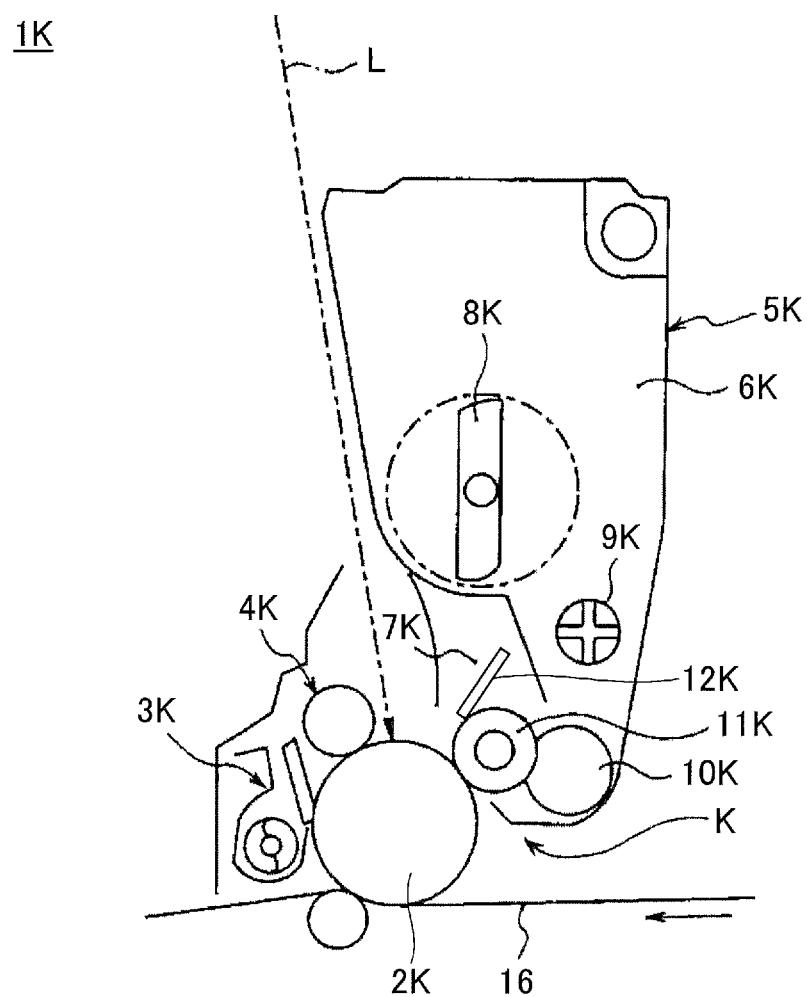
FIG. 2 is a diagram for explaining an example of a configuration of an image formation unit according to the embodiment.

As an example, a configuration of an image formation unit is described with reference to FIG. 2. FIG. 2 is a diagram for explaining an example of a configuration of an image formation unit 1K that forms a K-toner image. As illustrated in FIG. 2, the image formation unit 1K includes a photoconductor drum 2K, a cleaning unit 3K, a discharging unit, a charging roller 4K, and a developing unit 5K. The image formation unit 1K is detachable from the image forming apparatus 200. When the image formation unit 1K is detached from the image forming apparatus 200 to be replaced, consumables such as the photoconductor drum 2K provided in the image formation unit 1K can be replaced all together. In this description, the image forming apparatus 200 is an example of a "main unit", and the image formation unit 1K is an example of a "replacement unit."

The photoconductor drum 2K, which is an example of a latent image carrier, is driven to rotate at a predetermined rotating speed in a clockwise direction in FIG. 2. The charging roller 4K rotates in a clockwise direction in FIG. 2 to uniformly charge a surface of the photoconductor drum 2K. The surface of the charged photoconductor drum 2K is scanned using laser light L in an axial direction of the photoconductor drum 2K to be exposed, and an electrostatic latent image is then formed. The developing unit 5K develops the formed electrostatic latent image, and forms a K-toner image on the surface of the photoconductor drum 2K. The K-toner image is primarily transferred onto an intermediate transfer belt 16 to be described below.

After the primary transfer, the cleaning unit 3K removes residual transfer toner attached to the surface of the photoconductor drum 2K. After cleaning, the discharging unit discharges a residual charge of the photoconductor drum 2K.

Similarly, with respect to the image formation units 1Y, 1M, and 10 as well, a Y-toner image is formed on a photoconductor drum 2Y, an M-toner image is formed on a photoconductor drum 2M, and a C-toner image is formed on a photoconductor drum 2C. Those images are transferred onto the intermediate transfer belt 16 described below.

The developing unit 5K includes a vertically long hopper 6K for containing K-toner and a developing section 7K. In the hopper 6K, an agitator 8K, a stirring paddle 9K, a toner feed roller 10K, and the like are rotatably disposed. The K-toner in the hopper 6K is agitated by rotation of the agitator 8K or the stirring paddle 9K, and moves toward the toner feed roller 10K by a weight of the K-toner.

The developing section 7K of the developing unit 5K includes a developing roller 11K and a control blade 12K. The developing roller 11K rotates in a counterclockwise direction in FIG. 2 while contacting with the photoconductor drum 2K or the toner feed roller 10K. The control blade 12K contacts with a surface of the developing roller 11K at an edge portion of the control blade 12K.

The toner feed roller 10K is a roller that contacts with the developing roller 11K and that rotates in a counterclockwise direction in FIG. 2 while the K-toner in the hopper 6K is attached to a roller surface. The control blade 12K is a member formed of a metal plate. In this description, the control blade 12K is an example of a "control member," and the developing roller 11K is an example of a "toner carrier."

The K-toner attached to the toner feed roller 10K in the hopper 6K is fed to the surface of the developing roller 11K in a portion of the developing roller 11K and the toner feed roller 10K contacting with each other. The developing roller 11K and the toner feed roller 10K are rotatably driven such that their surfaces in contact are moved in opposite directions.

The toner feed roller 10K moves the surface contacting with the developing roller 11K in a direction opposite to the surface of the developing roller 11K. Thereby, K-toner on the developing roller 11K can be collected, or new K-toner can be fed to the developing roller 11K.

In accordance with rotation of the developing roller 11K, the K-toner fed to the developing roller 11K passes a portion of the developing roller 11K and the control blade 12K contacting with each other. In this case, the K-toner contacts with the control blade 12K, and thereby frictional electrostatic charge is increased in the K-toner. Further, a thickness of a toner layer on a roller surface is uniformly controlled. After the thickness of the layer is controlled, the K-toner is attached to a K-electrostatic latent image on the surface of the photoconductor drum 2K in a developing area where the developing roller 11K and the photoconductor drum 2K contact with each other. With such attachment, the K-electrostatic latent image is developed to produce a K-toner image.

Figure 3:
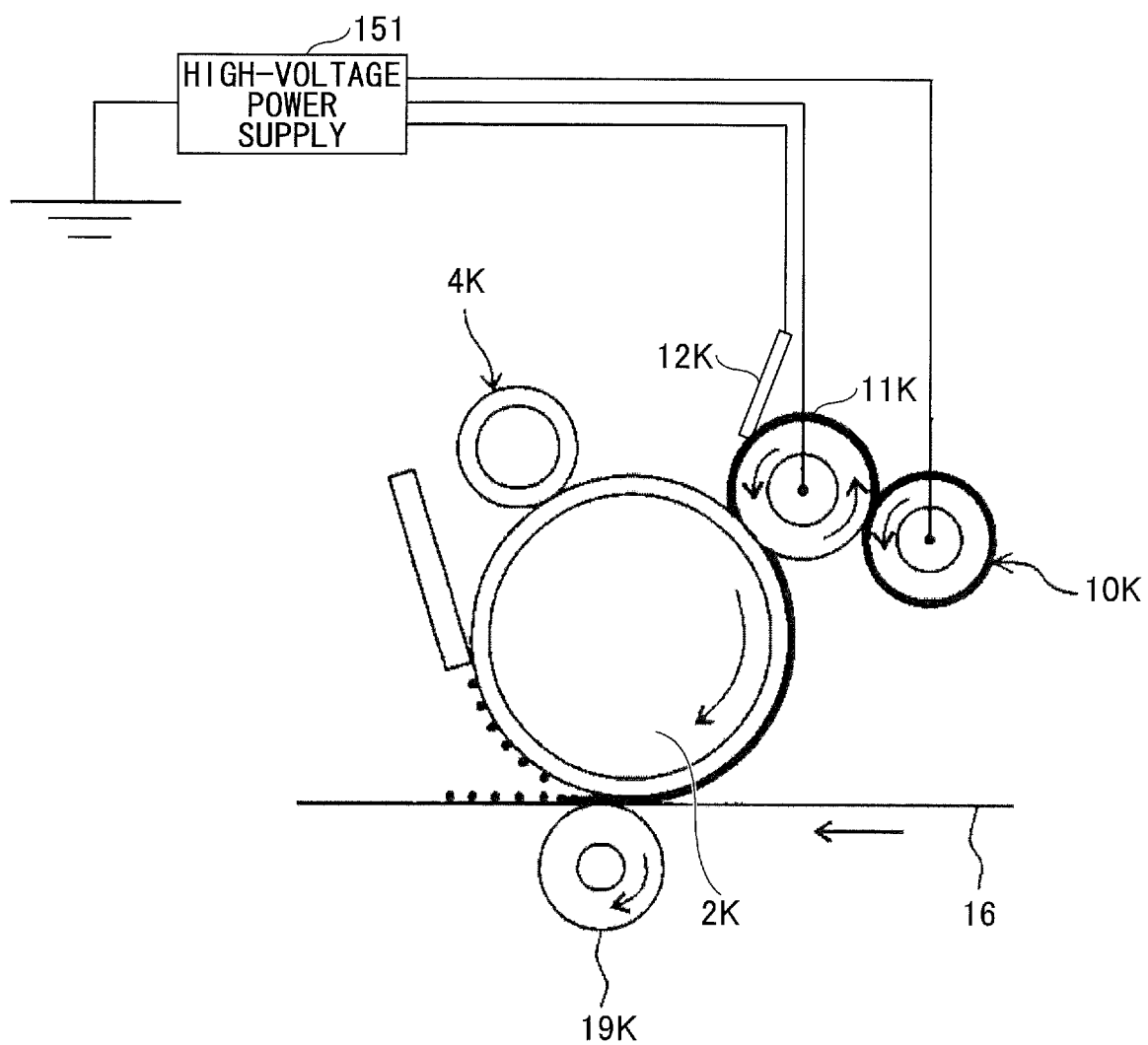
FIG. 3 is a diagram for explaining an example of a configuration in which a given bias voltage is applied to each member in the image formation unit according to the embodiment.

FIG. 3 is a diagram for explaining an example of a configuration in which a given bias voltage is applied to each of the members such as the control blade 12K in the image formation unit 1K. A high-voltage power supply 151 converts a voltage supplied through a commercial power supply or the like into a desired voltage. The high-voltage power supply 151 supplies the desired voltage to each of the toner feed roller 10K, the developing roller 11K and the control blade 12K. In such a manner, the high-voltage power supply 151 applies a bias voltage to each of the toner feed roller 10K, the developing roller 11K, and the control blade 12K.

A developing bias voltage is applied to the developing roller 11K. The developing bias voltage has a same polarity as charged K-toner. An absolute value of the developing bias voltage is set as a value between an absolute value of an electrostatic latent image potential and an absolute value of a potential at a surface portion of the photoconductor drum 2K.

A feed bias voltage is applied to the toner feed roller 10K. The feed bias voltage has a same polarity as charged K-toner. An absolute value of the feed bias voltage is greater than an absolute value of the developing bias voltage. For this reason, in a portion of the developing roller 11K and the toner feed roller 10K contacting with each other, an electrostatic force is applied to K-toner on the toner feed roller 10K in a direction from the toner feed roller 10K to the developing roller 11K. Thereby, the K-toner on the toner feed roller 10K can be efficiently transferred onto the developing roller 11K.

A control bias voltage is applied to the control blade 12K. The control bias voltage has a same polarity as charged K-toner. An absolute value of the control bias voltage is greater than an absolute value of the developing bias voltage. For this reason, the K-toner that enters a portion of the control blade 12K and the developing roller 11K contacting with each other is pressed into a surface of the developing roller 11K to increase frictional electrostatic charge.

As an example, in FIGS. 2 to 3, the K-image formation unit 1K is described. However, each of the image formation units 1Y, 1M, and 10 has a same configuration as the image formation unit 1K. A specific voltage value of each bias voltage will be described in detail below with reference to FIGS. 6A and 6B.

Returning to FIG. 1, a transfer unit 15 is provided under the image formation units 1Y, 1M, 10, and 1K. The transfer unit 15 includes an intermediate transfer belt 16, a driven roller 17, a driving roller 18, and four primary transfer rollers 19Y, 19M, 19C, and 19K. With respect to the transfer unit 15, an endless intermediate transfer belt 16, which is stretched, rotates in a counterclockwise direction in FIG. 1. The transfer unit 15 also includes a secondary transfer roller 20, a belt cleaning unit 21, and a cleaning assist roller 22.

The driven roller 17, the driving roller 18, the cleaning assist roller 22, and the four primary transfer rollers 19Y, 19M, 19C, and 19K are disposed on the inner side of the loop of the intermediate transfer belt 16. Each of the driven roller 17 and the driving roller 18 serves as a stretching roller that stretches the intermediate transfer belt 16. The driving roller 18 is driven to rotate in a counterclockwise direction in FIG. 1 to cause the intermediate transfer belt 16 to rotate in a same direction as the driving roller 18.

The rotating intermediate transfer belt 16 is sandwiched by the four primary transfer rollers 19Y, 19M, 19C, and 19K and the respective photoconductor drums 2Y, 2M, 2C, and 2K. In such a manner, a surface of the intermediate transfer belt 16 contacts with each of the photoconductor drums 2Y, 2M, 2C and 2K, and a primary transfer nip for each of Y, M, C, and K is formed.

A primary transfer bias is applied to each of the primary transfer rollers 19Y, 19M, 19C and 19K by a primary-transfer-bias power supply. In such a manner, a transfer electric field is created between electrostatic latent images on the photoconductor drums 2Y, 2M, 2C, and 2K and the respective primary transfer rollers 19Y, 19M, 19C and 19K.

When a Y-toner image formed on a surface of the photoconductor drum 2Y of the Y-image formation unit 1Y enters a Y-primary transfer nip in accordance with rotation of the photoconductor drum 2Y, such a Y-toner image is primarily transferred from the photoconductor drum 2Y onto the intermediate transfer belt 16, depending on a transfer electric field or nip pressure.

When the rotating intermediate transfer belt 16 onto which the Y-toner image is primarily transferred passes a primary transfer nip for each of M, C, and K, an M-toner image on the photoconductor drum 2M, a C-toner image on the photoconductor drum 2C and a K-toner image on the photoconductor drum 2K are sequentially superimposed on the Y-toner image to be primarily transferred. In such a manner, a four-color toner image is formed on the intermediate transfer belt 16.

The driving roller 18 serves as a transfer backing roller. Among all portions in a circumferential direction of the intermediate transfer belt 16, the transfer backing roller rotates a portion in which a secondary transfer nip is formed, in the circumferential direction of the intermediate transfer belt 16 to form a bent portion of the belt. The secondary transfer roller 20 of the transfer unit 15 contacts with such a bent portion of the belt, which is curved at a curvature of the driving roller 18, on a surface of the belt to form a secondary transfer nip.

A secondary transfer bias is applied to one of the secondary transfer roller 20 and the driving roller 18 by a transfer bias power supply. Another roller is connected to the ground. In such a manner, a secondary transfer electric field is created between the secondary transfer roller 20 and the driving roller 18.

A paper feeding cassette 30 that contains a plurality of papers P in the form of a bundle of papers is provided under the transfer unit 15. The paper feeding cassette 30 can slide with respect to a housing of the image forming apparatus 200. The paper feeding cassette 30 causes a top paper P of the paper bundle to contact with a paper feeding roller 30a. In accordance with the paper feeding roller 30a rotating in a counterclockwise direction in FIG. 1 at a predetermined timing, the paper P contacting with the paper feeding roller 30a can be fed to a paper feeding path 31.

A pair of resist rollers 32 is provided in proximity to a downstream end of the paper feeding path 31. The pair of resist rollers 32 is provided in an oblique upper direction on a paper ejection side of the paper feeding cassette 30. The paper P that is ejected in an approximately horizontal direction from within the feeding cassette 30 toward a front side of the feeding cassette is changed in direction after the ejection, and is conveyed toward a resist nip of the pair of resist rollers 32.

The pair of resist rollers 32 stops rotation of both rollers immediately when the paper P fed from the paper feeding cassette 30 is sandwiched by the rollers of the pair of resist rollers 32. Next, the pair of resist rollers 32 resumes rotation at the timing of the sandwiched paper P being able to be synchronized with the four-color toner image on the intermediate transfer belt 16 in the secondary transfer nip. The pair of resist rollers 32 then moves the paper P toward the secondary transfer nip.

The four-color toner image, which closely contacts with the paper P in the secondary transfer nip, on the intermediate transfer belt 16 is secondarily transferred for all four colors at once onto the paper P, being affected by a secondary transfer electric field or nip pressure. Such a four-color toner image is changed into a full color toner image in combination with a white color of the paper P. When the paper P on which the full color toner image is formed passes the secondary transfer nip, the paper P moves away from the secondary transfer roller 20 or the intermediate transfer belt 16 at a certain curvature. Such a paper P is conveyed to a fixing device 34 disposed above the secondary transfer nip, via a conveyance path 33 for after-transfer.

After the paper P passes the secondary transfer nip, residual transfer toner that has not been transferred onto the paper P is attached to the intermediate transfer belt 16. The belt cleaning unit 21 that contacts with a surface of the intermediate transfer belt 16 cleans such residual transfer toner from a belt surface. A cleaning assist roller 22, which is disposed on the inner side of the loop of the intermediate transfer belt 16, assists the belt cleaning unit 21 to clean a belt.

The fixing device 34 forms a fixing nip by a fixing roller 34a and a pressing roller 34b. The fixing roller 34a includes a heating element such as a halogen lamp. The pressing roller 34b rotates while contacting with the fixing roller 34a under predetermined pressure. The paper P that is carried to the fixing device 34 is received by the fixing nip, and a carry surface of a non-fixed toner image closely contacts with the fixing roller 34a. Toner in the toner image is then softened with heating or pressing that is achieved by the fixing roller 34a and the pressing roller 34b. Thus, a full color image is fixed to the paper P.

The paper P ejected from the inside of the fixing device 34 passes a conveyance path 35 for after-fixing, and then reaches a branch point between a paper ejection path 36 and a pre-paper-reversing conveyance path 41. A switching claw 42 that is driven to rotate around a rotating shaft 42a is provided on a lateral side of the conveyance path 35 for after-fixing. Rotation of the switching claw 42 allows closure or opening in proximity to a downstream end of the conveyance path 35 for after-fixing.

When the paper P is carried from the fixing device 34, the switching claw 42 stops in a rotating position as illustrated in a solid line in FIG. 1, and allows opening in proximity to the downstream end of the conveyance path 35 for after-fixing. Thereby, the paper P enters the paper ejection path 36 via the conveyance path 35 for after-fixing, and is sandwiched by rollers of the pair of paper ejection rollers 37.

When a single-side print mode is set by an input operation using an operation section including a numeric keypad or the like or by a control signal sent from a personal computer or the like, the paper P sandwiched by the pair of paper ejection rollers 37 is ejected directly to the outside of the image forming apparatus 200. The paper P is stacked in a stack section that is formed on an upper surface of an upper cover 50 of the housing.

On the other hand, when a double-side print mode is set, a rear end side of the paper P that is conveyed along the paper ejection path 36 passes the conveyance path 35 for after-fixing, while a front end side of the paper P is sandwiched by the pair of paper ejection rollers 37. The switching claw 42 then rotates to a position as indicated by a dashed line in FIG. 1, and allows closure in proximity to a downstream end of the conveyance path 35 for after-fixing. Approximately at the same time as the switching claw 42 rotating, the pair of paper ejection rollers 37 starts to rotate backwards, and the paper P is conveyed with a rear end of the paper P directed as a front head to enter the pre-paper-reversing conveyance path 41.

A right end portion of the image forming apparatus 200 rotates around a rotating shaft 40*a* to serve as a reverse unit 40 that can be opened and closed with respect to a housing body. When the pair of paper ejection rollers 37 rotates backwards, a paper P enters the pre-paper-reversing conveyance path 41 of the reverse unit 40, and is conveyed from an upper side to a lower side in a vertical direction. After passing between rollers of a pair of reverse conveyance rollers 43, the paper P enters a reverse conveyance path 44 that is curved in a semicircle. Further, when the paper P is conveyed along the curved shape of the reverse conveyance path 44, an upper surface of the paper P is reversed into a lower surface of the paper while a direction of the paper moving from an upper side to a lower side in a vertical direction is also reversed. The paper P is then conveyed from the lower side to the upper side in a vertical direction. Next, the paper P again enters the secondary transfer nip via the paper feeding path 31. After a full color image is secondarily transferred onto another side of the paper P at once, the paper P is sequentially conveyed via the conveyance path 33 for after-transfer, the fixing device 34, the conveyance path 35 for after-fixing, the paper ejection path 36, and the pair of paper ejection rollers 37. The paper P is ejected outside the image forming apparatus 200.

Figure 4:
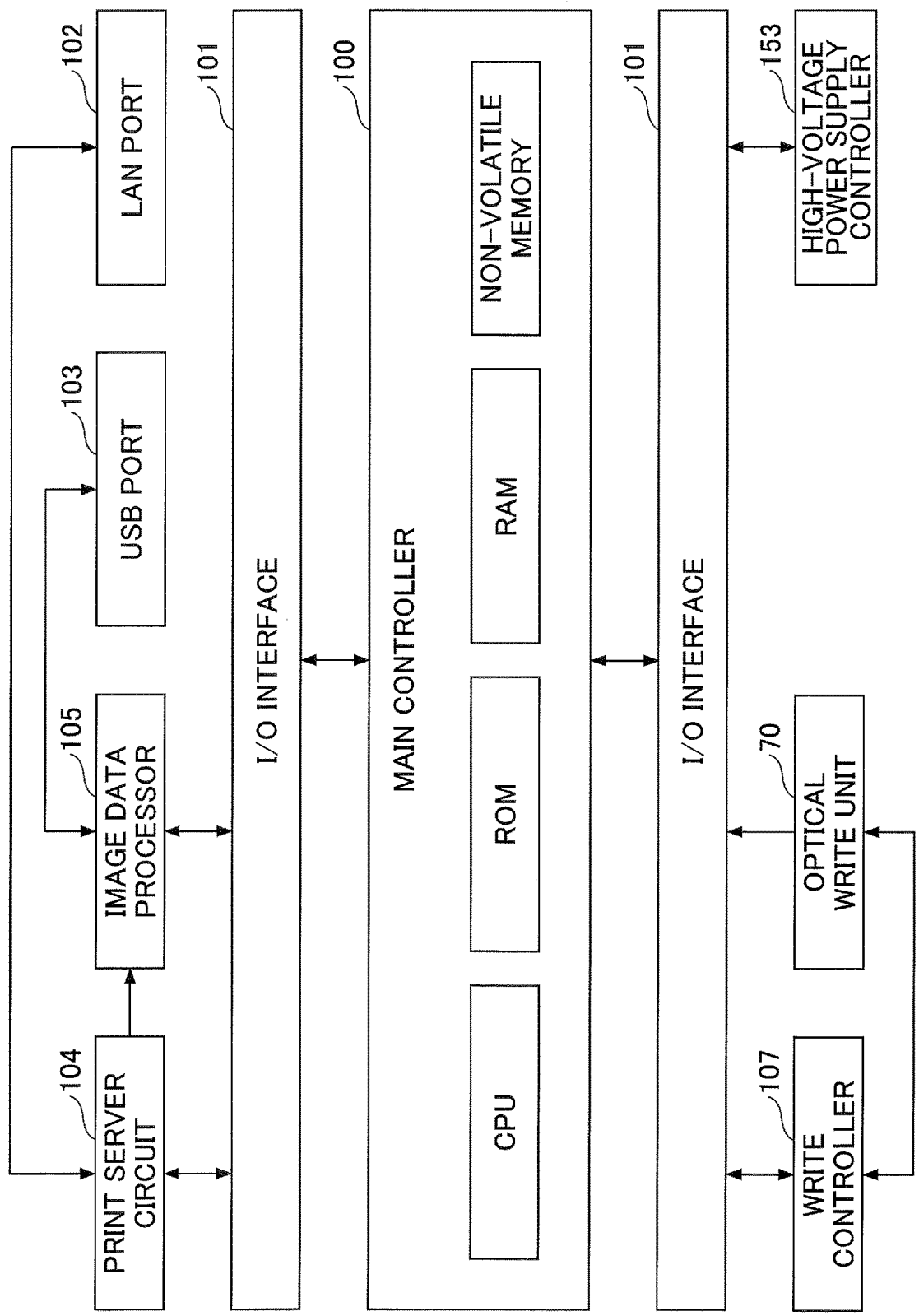
FIG. 4 is a block diagram illustrating an example of a hardware configuration of the image forming apparatus according to the embodiment.

FIG. 4 is a block diagram illustrating an example of a hardware configuration of the image forming apparatus according to the present embodiment. A main controller 100 includes a CPU (Central Processing Unit), a RAM (Random Access Memory), a ROM (Read Only Memory), and a non-volatile memory. The main controller 100 performs overall control of driving of various devices in the entire printer, and performs processing of calculation.

The main controller 100 is electrically coupled to a print server circuit 104, an image data processor 105, a LAN (Local Area Network) port 102, and the like via an I/O (input and output) interface 101. The main controller 100 is coupled to a USB port 103, a write controller 107, a unit replacement detector, an optical write unit 70, a high-voltage power supply controller 153, and the like, via the I/O interface 101.

The high-voltage power supply controller 153 controls output of the high-voltage power supply 151 based on a control signal inputted from the main controller 100. For example, an output value of a developing bias voltage is controlled, an output value of a feed bias voltage is controlled, or an output value of a control bias voltage is controlled.

The LAN port 102 can communicate with a personal computer or a scanner via an external local area network to acquire image data of an image to be outputted. A USB port 103 can also communicate with an external personal computer over a USB cable to acquire image data of an image to be outputted.

Image data inputted from a personal computer to the LAN port 102 via a local area network is inputted to the image data processor 105 via the print server circuit 104. Color image data inputted to the USB port 103 from a personal computer is directly inputted to the image data processor 105.

The image data processor 105 separates received color image data into color-separation image data for each of R (Red), G (Green), and B (Blue). The image data processor 105 then converts such color-separation image data into color-separation image data for each of the four colors of Y, M, C, and K. An obtained color-separation image data for each of Y, M, C, and K is transmitted to the write controller 107. Based on the color-separation image data for Y, M, C, and K received from the image data processor 105, the write controller 107 controls driving of the optical write unit 70 to optically scan the respective photoconductor drums 2Y, 2M, 2C and 2K. Further, the write controller 107 transmits a page synchronization signal for synchronizing pages to the main controller 100 or the high-voltage power supply controller 153.

The main controller 100 controls feeding of a paper P from the paper feeding cassette 30 or the pair of resist rollers 32, based on a page synchronization signal. The high-voltage power supply controller 153 controls an output value of each bias based on a page synchronization signal.

<Configuration of Bias-Voltage Changing Circuit>

Hereafter, a function and a configuration of a bias-voltage changing circuit according to the present embodiment is described.

As described above, a control blade 12K is provided with a developing section 7K of a developing unit 5K. With respect to K-toner fed to a developing roller 11K, a thickness of a toner layer on a roller surface is uniformly controlled by the control blade 12K. In this case, an additive or finely divided toner having an opposite polarity to a control bias voltage may be attached to the control blade 12K to adhere to the control blade 12K.

Figure 5:
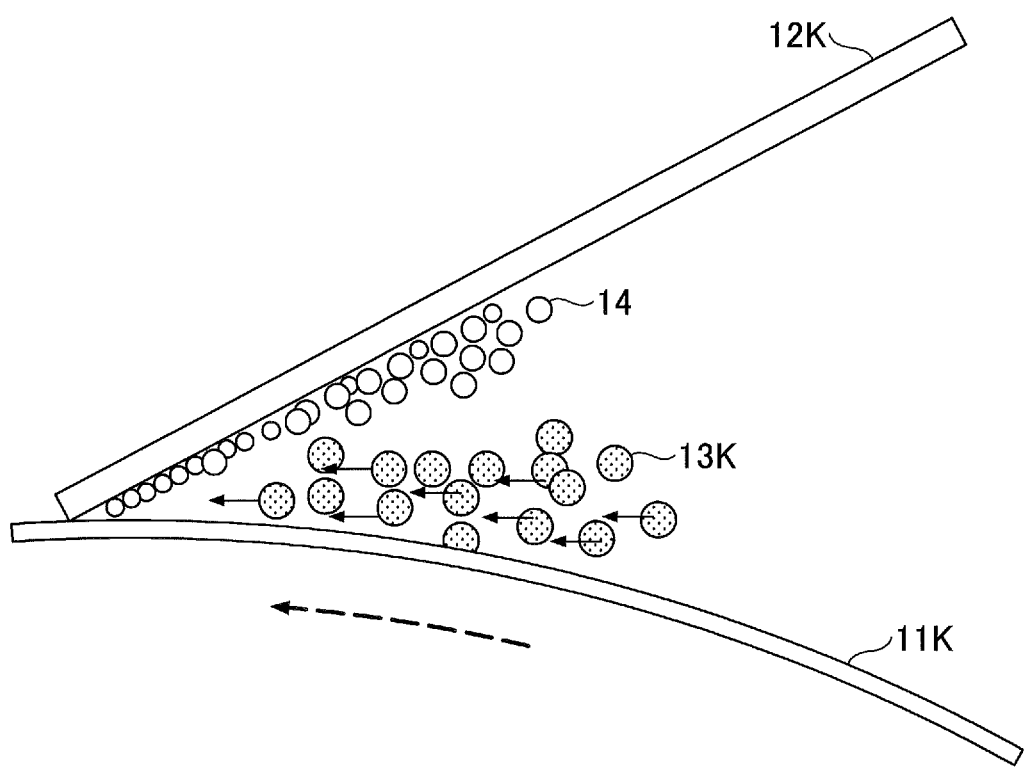
FIG. 5 is a diagram for explaining a state in which finely divided toner adheres to a control blade.

FIG. 5 is a diagram for explaining a state in which finely divided toner 14 adheres to a control blade 12K. A developing roller 11K rotates in a direction indicated by a dashed arrow in FIG. 5. K-toner 13K is fed to a surface of the developing roller 11K, and moves in a direction indicated by a solid arrow in accordance with the developing roller 11K rotating. When the K-toner 13K passes a portion of the developing roller 11K and the control blade 12K contacting with each other, a thickness of a toner layer on a roller surface is uniformly controlled.

Since a control bias voltage having a same polarity as the toner is applied to the control blade 12K by the high-voltage power supply 151, the K-toner 13K is not attached to the control blade 12K due to repulsion. However, finely divided toner 14 having an opposite polarity to the control bias voltage is attracted to the control blade 12K to be attached to the control blade 12K. When such finely divided toner 14, an additive, or the like that has an opposite polarity to the control bias voltage adheres to the control blade 12K, an abnormal image such as scumming may be formed in a process of image formation.

Note that the finely divided toner means tiny toner that is included in grinded toner and that does not contribute to image formation. The additive means a material on a surface of toner particles to prevent the toner particles from adhering to each other.

In the present embodiment, when an image formation unit 1K is replaced due to a lifespan of consumables, or the like, a control bias voltage is changed to be lower than a default voltage. Thereby, attraction of an additive, finely divided toner, or the like having an opposite polarity, to the control blade 12K is suppressed. Accordingly, formation of abnormal images is prevented.

In this case, a control bias voltage is also changed by the bias-voltage changing circuit. Thereby, a control bias voltage can be changed at a low cost without providing a switching mechanism in the image formation unit 1K. Also, a service person for replacement does not need to actively make changes to a control bias voltage.

Figure 6A:
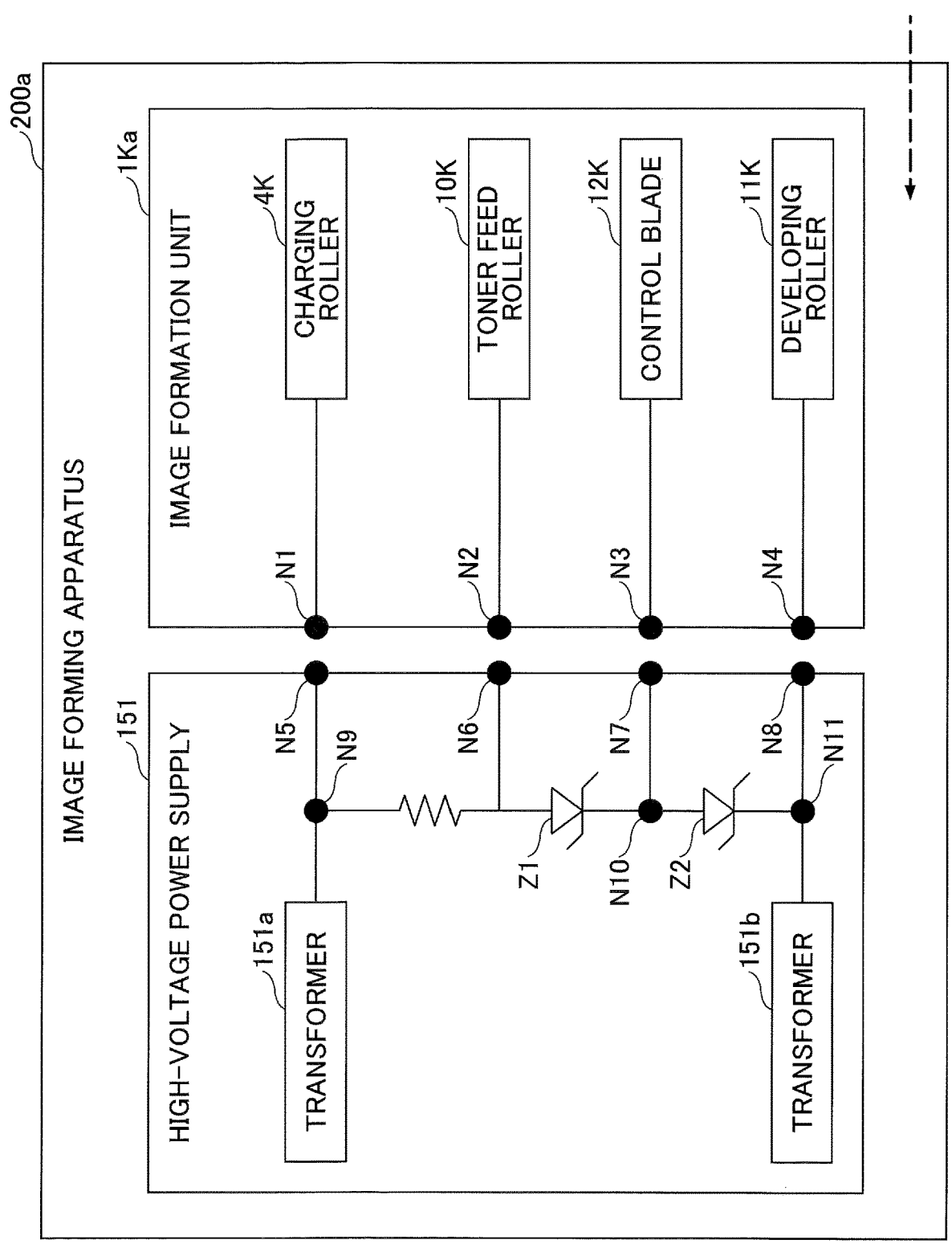
FIG. 6A is a diagram for explaining an example of a given bias voltage applied to each member in a default image formation unit when the default image formation unit is attached.
Figure 6B:
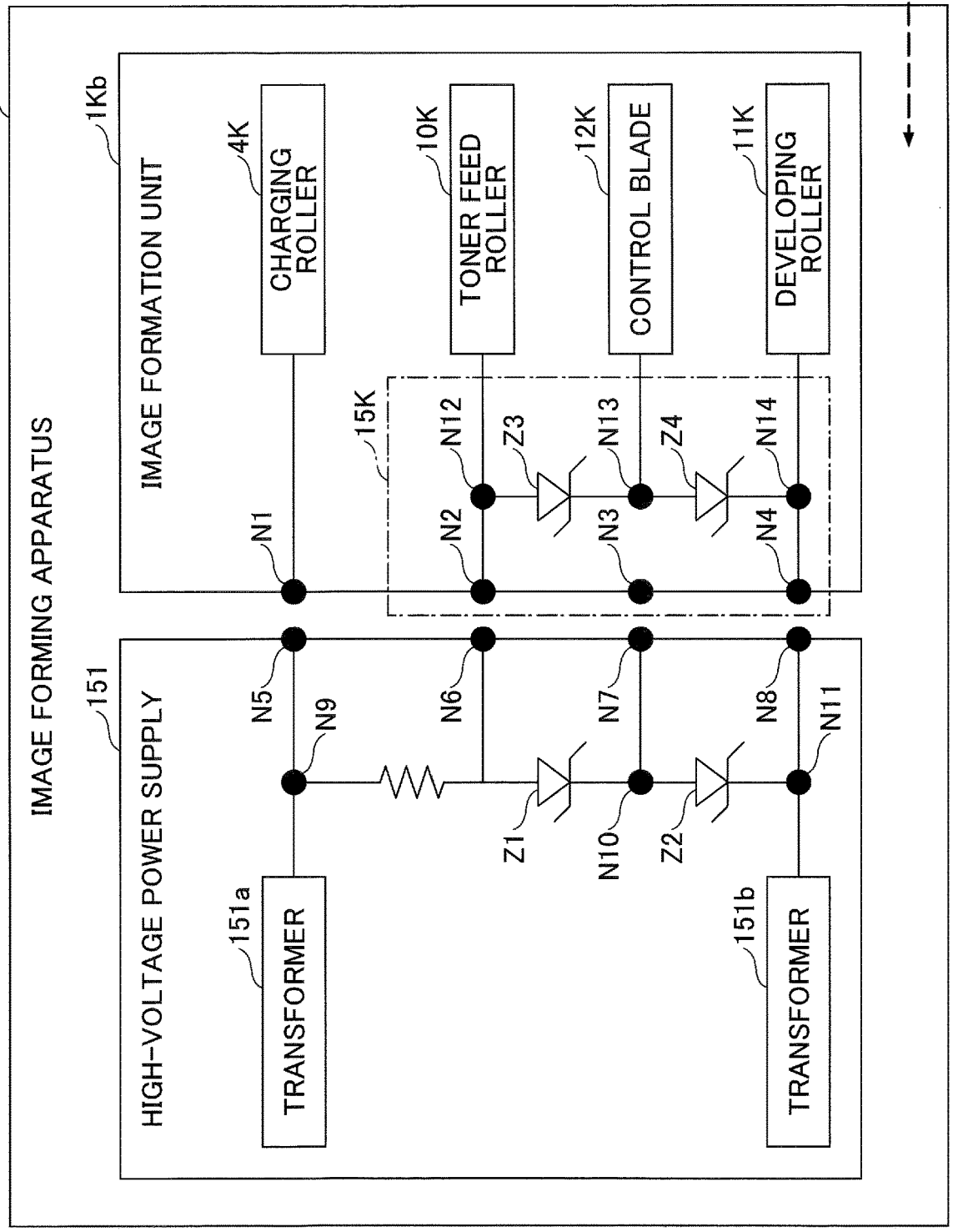
FIG. 6B is a diagram for explaining an example of a given bias voltage applied to each member in an image formation unit when the image formation unit according to the embodiment is attached.

A configuration of the bias-voltage changing circuit according to the present embodiment is described with reference to FIGS. 6A and 6B. FIGS. 6A and 6B are diagrams for explaining a bias voltage applied to each member in an image formation unit.

FIG. 6A is a diagram for explaining an example of a bias voltage applied to each member in a default image formation unit 1Ka when the default image formation unit 1Ka is attached to an image forming apparatus 200a. Note that a default image formation unit is an image formation unit attached to an image forming apparatus before shipment, for example. In other words, the default image formation unit means an image formation unit to which a control bias voltage "before the change" is applied.

FIG. 6B is a diagram for explaining an example of a bias voltage applied to each member in an image formation unit 1Kb for replacement when the image formation unit 1Kb is attached to an image forming apparatus 200b. Note that an image formation unit for replacement is an image formation unit that serves as a replacement for a default image formation unit, which is a commercially available product, due to a lifespan of the default image formation unit after shipment of the image forming apparatus 200a, for example. In other words, the image formation unit for replacement means an image formation unit to which a control bias voltage "after the change" is applied.

In FIGS. 6A and 6B, the respective image formation units 1Ka and 1Kb slide in a direction indicated by a dashed arrow to be attached. Where, contacts N1, N2, N3, and N4 provided with each of the image formation units 1Ka and 1Kb are electrically coupled to respective contacts N5, N6, N7, and N8 provided with a high-voltage power supply 151. In this example, with the image formation unit 1Ka or the image formation unit 1Kb being attached, the contact N1 is electrically coupled to the contact N5, and the contact N2 is electrically coupled to the contact N6. Further, the contact N3 is electrically coupled to the contact N7, and the contact N4 is electrically coupled to the contact N8. In FIGS. 6A and 6B, a state just before the image formation units 1Ka and 1Kb are attached is illustrated. In other words, a state just before the contacts N1, N2, N3, and N4 are electrically coupled to the respective contacts N5, N6, N7, and N8 is illustrated.

Each of the image forming apparatus 200a and 200b includes a high-voltage power supply 151, and each high-voltage power supply 151 includes a transformer 151a and a transformer 151b.

The transformer 151a boosts an input voltage, and applies a charging bias voltage to a charging roller 4K. The transformer 151b boosts an input voltage, and applies a developing bias voltage to a developing roller 11K. The transformer 151b also applies a control bias voltage to a control blade 12K, and applies a feed bias voltage to a toner feed roller 10K.

Between the transformers 151a and 151b, Zener diodes (constant voltage diodes) Z1 and Z2 are coupled in series to form a series circuit. A Zener diode is an electrical element used to allow a constant voltage as a reference. By coupling the Zener diodes, a constant voltage as defined by a given breakdown voltage can be obtained.

A bias voltage applied to each member is hereafter described with reference to a specific example of a voltage value. In FIG. 6A, the transformer 151a converts an input voltage into a voltage (Vc) of −1100V. A charging bias voltage of −1100V is applied to the charging roller 4K when the contact N5 and the contact N1 are coupled to each other.

The transformer 151b converts an input voltage into a voltage (Vb) of −200V. A developing bias voltage of −200V is applied to the developing roller 11K when the contact N8 and the contact N4 are coupled to each other. An output voltage of the transformer 151b drops to −400V via the Zener diode Z2 across which a breakdown voltage is −200V. A control bias voltage of −400V is applied to the control blade 12K when the contact N7 and the contact N3 are coupled to each other.

An output voltage of the transformer 151b drops to −450V via the Zener diode Z1 across which a breakdown voltage is −50V. A feed bias voltage of −450V is applied to the toner feed roller 10K when the contact N6 and the contact N2 are coupled to each other.

In FIG. 6B, the image formation unit 1Kb includes a bias-voltage changing circuit 15K, and the bias-voltage changing circuit 15K includes Zener diodes Z3 and Z4 coupled in series. A breakdown voltage across the Zener diode Z3 is −100V, and a breakdown voltage across the Zener diode Z4 is −100V.

When the image formation unit 1Kb is attached to the image forming apparatus 200b, the Zener diodes Z3 and Z4 coupled in series are arranged in parallel with the Zener diodes Z1 and Z2 coupled in series, which are provided with the high-power power supply 151 of the image forming apparatus 200b. The Zener diodes Z1, Z2, Z3, and Z4 form a parallel circuit.

When a plurality of Zener diode groups in each of which Zener diode(s) are coupled in series are coupled to form a parallel circuit, only a Zener diode group of a smaller value with respect to the total absolute value of breakdown voltages across respective Zener diodes operates. In the above example, with respect to the Zener diodes Z1 and Z2, the total absolute value of breakdown voltages is 250V. With respect to the Zener diodes Z3 and Z4, the total absolute value of breakdown voltages is 200V. In such a manner, only the Zener diodes Z3 and Z4 operate because the total absolute value of breakdown voltages across the Zener diodes Z3 and Z4 is smaller.

In FIG. 6B, the transformer 151b converts an input voltage into a voltage (Vb) of −200V. A developing bias voltage of −200V is applied to a developing roller 11K when the contact N8 and the contact N4 are coupled to each other. An output voltage of the transformer 151b drops to −300V via the Zener diode Z4 across which a breakdown voltage is −100V. A control bias voltage of −300V is applied to the control blade 12K when the contact N8 and the contact N4 are coupled to each other. An output voltage of the transformer 151b drops to −400V via the Zener diode Z3 across which a breakdown voltage is −100V. A feed bias voltage of −400V is applied to the toner feed roller 10K when the contact N6 and the contact N2 are coupled to each other.

In such a manner, the image formation unit 1Kb can change a control bias voltage of −400V in a default state (FIG. 6A) to −300V when replacing (FIG. 6B). By lowering a control bias voltage, it is possible to suppress an additive, finely divided toner, or the like being attracted to the control blade 12K. Where, the additive, the finely divided toner, or the like has an opposite polarity to a control bias voltage. Thereby, formation of abnormal images is prevented.

In the present embodiment, the total absolute value of breakdown voltages of the Zener diodes Z3 and Z4 is smaller than the total absolute value of breakdown voltages of the Zener diodes Z1 and Z2. Thereby, when the image formation unit 1Kb is attached to the image forming apparatus 200b, only the Zener diodes Z3 and Z4 operate. Accordingly, it is possible to lower a control bias voltage by simply attaching the image formation unit 1Kb to the image forming apparatus 200b.

The bias-voltage changing circuit 15K with the Zener diodes Z3 and Z4 has a simple construction, and decreases the cost. Thereby, it is possible to change a bias voltage applied to given member(s) in a replacement unit at a low cost when the replacement unit such as an image formation unit is replaced.

Note that each of the Zener diodes Z1 and Z2 is an example of a Zener diode in a main unit, and each of the Zener diodes Z3 and Z4 is an example of a Zener diode in a replacement unit.

In the above embodiment, the bias-voltage changing circuit 15K of the image formation unit 1K has been described by way of example. However, other image formation units 1Y, 1O, and 1M also have respective bias-voltage changing circuits, each of which has a function and a configuration that are same as the bias-voltage changing circuit 15K.

In each of FIGS. 6A and 6B, the high-power power supply 151 applies a given bias voltage to each member in an image formation unit 1K. However, the same high-power power supply 151 may additionally apply a given bias voltage to each member in each of other image formation units 1Y, 1O and 1M.

Alternatively, each of the image formation units 1Y, 1O, 1M and 1K may include a high-power power supply.

In the present embodiment, as an example, the image forming apparatus 200 is a full-color-image forming apparatus. However, a monochrome image forming apparatus can also have a similar effect to the full-color-image forming apparatus.

Second Embodiment

In the present embodiment, as an example, a combination of Zener diodes determined taking into account a tolerance for breakdown voltage and temperature characteristics of each Zener diode is described.

With respect to (1) below, as an example, a range of variations in breakdown voltages across Zener diodes due to a tolerance for breakdown voltage is listed. With respect to (2) below, as an example, a range of variations in breakdown voltages across Zener diodes due to temperature characteristics is listed. Note that VZ1 represents a breakdown voltage across a Zener diode Z1, VZ2 represents a breakdown voltage across a Zener diode Z2, VZ3 represents a breakdown voltage across a Zener diode Z3, and VZ4 represents a breakdown voltage across a Zener diode Z4.

With respect to each of (1) and (2) below, "/" indicates a relationship between an upper limit of an increased amount and a lower limit of a decreased amount with respect to an allowable variation. For example, VZ1 below indicates that 51V is a typical value, which may vary by −2V to +4V.

(1) Range of Variations Due to a Tolerance
VZ1: 51V+4V/−2V
VZ2: 200V+12V/−12V
VZ3: 100V+6V/−6V
VZ4: 100V+6V/−6V (2) Range of Variations Due to Temperature Characteristics
VZ1: 51V+1V/−2V
VZ2: 200V+4V/−10V
VZ3: 100V+2V/−5V
VZ4: 100V+2V/−5V According to the above (1) and (2), the sum of greatest values of VZ3 and VZ4 is 216V, which is less than the sum of smallest values of VZ1 and VZ2 being 225V. In this case, only a Zener diode group consisting of Zener diodes Z3 and Z4 can operate to lower a control bias voltage.

As described above, a combination of Zener diodes can be determined taking into account a tolerance for breakdown voltage and temperature characteristics of each Zener diode.

Note that other effects are same as the effects described in the first embodiment.

Explanation has been provided above for an image forming apparatus and an image forming method according to the embodiments. However, the present disclosure is not limited to the above embodiments, and various modifications and modifications can be made within the scope of the present disclosure.

What is claimed is:

1. A bias circuit comprising:
   one or more first Zener diodes electrically coupled to a member provided in a replacement unit, the one or more first Zener diodes being coupled in series,
   wherein in response to removably connecting the replacement unit to a main unit including a power supply that has one or more second Zener diodes coupled in series, the first Zener diodes are electrically coupled to the second Zener diodes in parallel to change a bias voltage to be applied to the member, the bias voltage being supplied by the power supply, and
   wherein a total absolute value of breakdown voltages across the first Zener diodes is lower than a total absolute value of breakdown voltages across the second Zener diodes to:
   bring the second Zener diodes into a non-operation state; and
   bring the first Zener diodes into an operation state for supplying the bias voltage from the power supply to the member.

2. The bias circuit according to claim 1, wherein each first Zener diode has an anode and a cathode, and wherein the member is electrically coupled to the anode of a given first Zener diode from among the one or more first Zener diodes, and the cathode of the given first Zener diode is electrically coupled to the power supply.

3. The bias circuit according to claim 2, wherein the replacement unit includes a plurality of contacts for making electrical contact with the power supply, and wherein the cathode of the given first Zener diode is electrically coupled to a given contact from among the plurality of contacts.

4. The bias circuit according to claim 1, wherein before the replacement unit is removably connected to the main unit, a bias voltage applied to the member is supplied by the power supply via a given second Zener diode from among the one or more second Zener diodes, and
   wherein a breakdown voltage drop across the given first Zener diode is lower than a breakdown voltage drop across the given second Zener diode.

5. The bias circuit according to claim 1, wherein the total absolute value of breakdown voltages across the first Zener diodes, as well as the total absolute value of breakdown voltages across the second Zener diodes, are determined taking into account a tolerance for breakdown voltage and temperature characteristics of each of the first Zener diodes and the second Zener diodes.

6. An image formation device comprising:
a latent image bearer;
a toner bearer configured to develop a latent image on the latent image bearer by using toner carried on a surface of the toner bearer;
a control member configured to contact with the toner bearer to control an amount of toner on the surface of the toner bearer;
a bias circuit including one or more first Zener diodes coupled in series, the one or more first Zener diodes being electrically coupled to the control member,
wherein in response to removably connecting the image formation device to an image forming apparatus including a power supply that has one or more second Zener diodes coupled in series, the one or more first Zener diodes are electrically coupled to the one or more second Zener diodes in parallel to change a bias voltage to be applied to the control member, the bias voltage being supplied by the power supply, and
wherein a total absolute value of breakdown voltages across the first Zener diodes is lower than a total absolute value of breakdown voltages across the second Zener diodes to:
bring the second Zener diodes into a non-operation state; and
bring the first Zener diodes into an operation state for supplying the bias voltage from the power supply to the control member.

7. The image formation device according to claim 6, wherein the changed bias voltage is lower than a bias voltage before the image formation device is removably connected to the image forming apparatus.

8. An image forming apparatus comprising the image formation device according to claim 7.

9. An image forming apparatus comprising the image formation device according to claim 6.

10. The image formation device according to claim 6, wherein each first Zener diode has an anode and a cathode, and wherein the control member is electrically coupled to the anode of a given first Zener diode from among the one or more first Zener diodes, and the cathode of the given first Zener diode is electrically coupled to the power supply.

11. The image formation device according to claim 10, further comprising a plurality of contacts for making electrical contact with the power supply,
wherein the cathode of the given first Zener diode is electrically coupled to a given contact from among the plurality of contacts.

12. The image formation device according to claim 11, wherein before the image formation device is removably connected to the image forming apparatus, a bias voltage applied to the control member is supplied by the power supply via a given second Zener diode from among the one or more second Zener diodes, and
wherein a breakdown voltage drop across the given first Zener diode is lower than a breakdown voltage drop across the given second Zener diode.

13. The image formation device according to claim 6, wherein the total absolute value of breakdown voltages across the first Zener diodes, as well as the total absolute value of breakdown voltages across the second Zener diodes, are determined taking into account a tolerance for breakdown voltage and temperature characteristics of each of the first Zener diodes and the second Zener diodes.

14. The image formation device according to claim 6, wherein the toner is charged, and wherein the bias voltage has a same polarity as the toner.

15. The image formation device according to claim 14, wherein the same polarity is a negative polarity.

* * * * *